(12) United States Patent
Obata et al.

(10) Patent No.: US 7,574,273 B2
(45) Date of Patent: Aug. 11, 2009

(54) AUDIO RECORDING DEVICE

(75) Inventors: Yasushi Obata, Takatsuki (JP); Hitoshi Miyamoto, Yao (JP); Toshihiro Waguri, Kobe (JP)

(73) Assignees: Sanyo Electric Co., Ltd., Moriguchi-Shi (JP); Sanyo Technosound Co., Ltd., Daito-Shi (JP)

( * ) Notice: Subject to any disclaimer, the term of this patent is extended or adjusted under 35 U.S.C. 154(b) by 695 days.

(21) Appl. No.: 10/523,402

(22) PCT Filed: Aug. 7, 2003

(86) PCT No.: PCT/JP03/10101

§ 371 (c)(1),
(2), (4) Date: Feb. 3, 2005

(87) PCT Pub. No.: WO2004/015687

PCT Pub. Date: Feb. 19, 2004

(65) Prior Publication Data

US 2006/0095149 A1    May 4, 2006

(30) Foreign Application Priority Data

Aug. 8, 2002    (JP)  ............................. 2002-231035

(51) Int. Cl.
*G06F 17/00* (2006.01)
*H04R 25/00* (2006.01)

(52) U.S. Cl. ........................................ 700/94; 381/361

(58) Field of Classification Search .................... 439/11, 439/31, 131; 381/355, 361–363, 365, 366, 381/375, 383–385, 387, 388, 390, 333; D14/225, D14/203.1, 203.3, 203.4, 203.8, 259, 154, D14/167, 227, 229, 480.1, 480.6, 480.3, 435.1, D14/432, 356, 480.7; 379/443.13, 330, 433.03, 379/329, 420.03, 426, 454, 447, 388.02; 386/118; 361/142, 679.23, 679; 367/188

See application file for complete search history.

(56) References Cited

U.S. PATENT DOCUMENTS 2,928,908 A * 3/1960 Muller .......................... 381/91

(Continued)

FOREIGN PATENT DOCUMENTS

CN    2488109 Y    5/2002

(Continued)

OTHER PUBLICATIONS

Japanese Registered Utility Model Publication 3080552.

(Continued)

*Primary Examiner*—Curtis Kuntz
*Assistant Examiner*—Joseph Saunders, Jr.
(74) *Attorney, Agent, or Firm*—Kratz, Quintos & Hanson, LLP

(57) ABSTRACT

An audio recording device is provided with a first casing, which includes a sound collection means, a second casing, which includes a terminal for connection to an external device. One end portion of the second casing is rotatably joined to a lower end portion of the first casing, such that the second casing can be folded and stored on a rear side of the first casing; the sound collection means is provided at an upper portion of the first casing; and the connection terminal is protrudingly provided on another end portion of the second casing. Furthermore, a recessed portion, into which the connection terminal is fitted, may be formed at a raised portion on the rear side of the first casing, and a front end portion of the connection terminal may be covered by a wall of the recessed portion when the second casing is in a folded and stored state.

14 Claims, 8 Drawing Sheets

U.S. PATENT DOCUMENTS

| | | | | |
|---|---|---|---|---|
| 5,638,455 | A | * | 6/1997 | Peiker .................. 381/361 |
| 5,691,882 | A | * | 11/1997 | Ma ....................... 361/684 |
| 6,246,570 | B1 | * | 6/2001 | Kim .................. 361/679.23 |
| 6,490,163 | B1 | * | 12/2002 | Pua et al. .............. 361/737 |
| 6,567,273 | B1 | * | 5/2003 | Liu et al. .............. 361/737 |
| 6,626,704 | B1 | * | 9/2003 | Pikel .................... 439/638 |
| 6,769,603 | B2 | * | 8/2004 | Nagai et al. ........... 235/375 |

FOREIGN PATENT DOCUMENTS

| | | |
|---|---|---|
| EP | 1139540 A1 | 10/2001 |
| JP | 2001-078452 | 3/2001 |
| JP | 2001-236096 | 8/2001 |
| JP | 2002-74296 A | 3/2002 |

OTHER PUBLICATIONS

Katsuhiro Sato et al., "Digital Memory Player <SSP-PD7>".

Kenji Hirao et al., "Digital Memory Recorder <SSP-PD77B>".

Yoshimasa Ono et al., "USB Chokketsu-gata Digital Memory Recorder".

Takashi Yagashira et al., "Text Onsei Henkan LSI no Kaihatsu".

USB Direct Setsuzoku Kano Sekai Saisyo—Saikeiryo no 'Thumb Drive'.

Japanese Registered Utility Model Publication 3080552. Sep. 28, 2001.

Katsuhiro Sato et al., "Digital Memory Player <SSP-PD7>". Jan. 20, 2001.

Kenji Hirao et al., "Digital Memory Recorder <SSP-PD77B>". Jun. 10, 2002.

Yoshimasa Ono et al., "USB Chokketsu-gata Digital Memory Recorder".Jun. 1, 2003.

Takashi Yagashira et al., "Text Onsei Henkan LSI no Kaihatsu". Sep. 27, 1995.

USB Direct Setsuzoku Kano Sekai Saisyo—Saikeiryo no 'Thumb Drive'.Oct. 1, 2000.

* cited by examiner

FIG. 5A
FIG. 5B
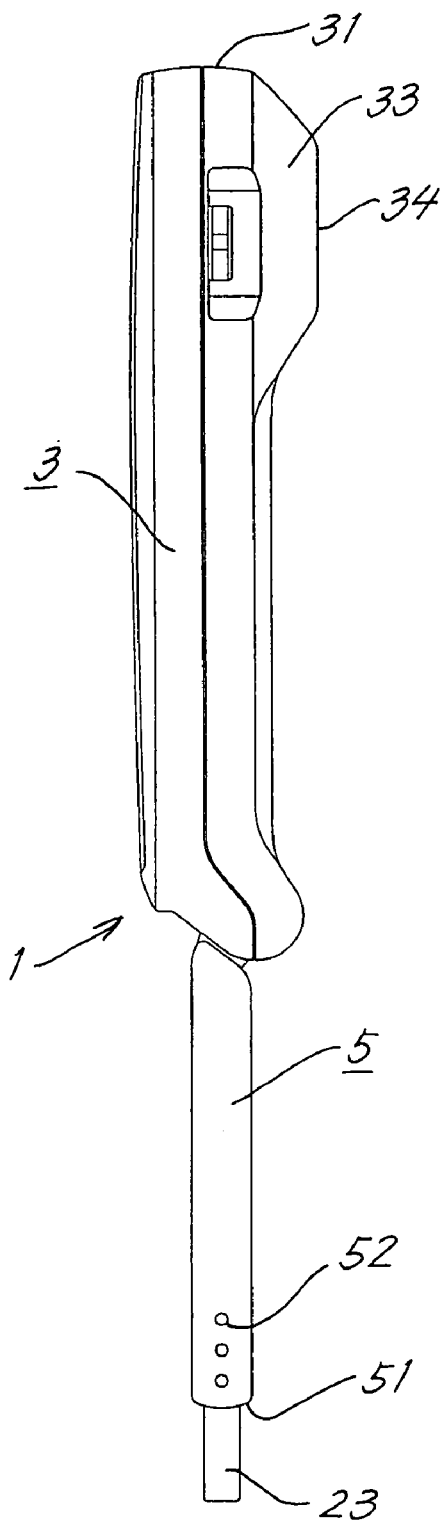
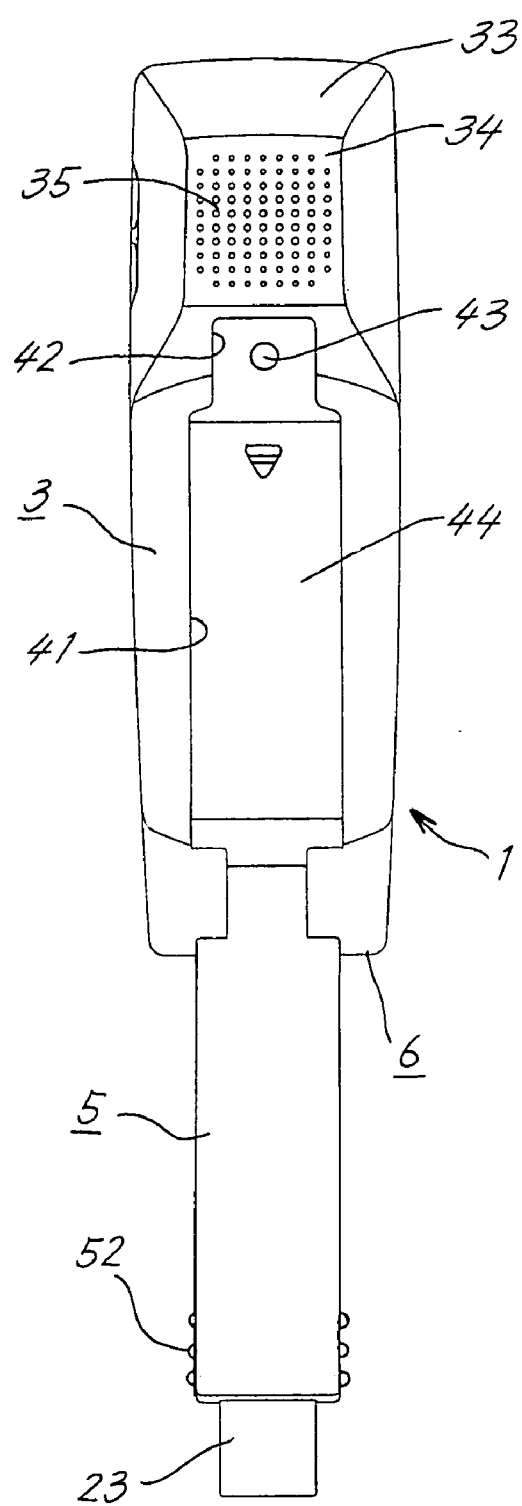

AUDIO RECORDING DEVICE

TECHNICAL FIELD

The present invention relates to an audio recording device, which stores audio data in an IC memory or other type of recording medium, in particular an audio recording device, which can transmit audio data to and from an external device.

BACKGROUND ART

In recent years, audio recording devices that convert analog audio signals obtained by a microphone or other sound collection means to digital audio data and store the digital audio data in an IC memory have become common. Such audio recording devices do not require a rotary drive mechanism and therefore have the advantages of being lightweight and compact when compared with audio recording devices which use magnetic tape or magnetic optical disks as a recording medium.

There are audio recording devices that use an IC memory as a recording medium, which can be connected to a personal computer (hereafter, "PC") and transmit digital audio data to and from the PC. USB (Universal Serial Bus) is widely used for transmission of data between the audio recording device and the PC.

FIG. 9 shows the mechanism for connecting a conventional audio recording device (1) and a PC (8). The audio recording device (1) is provided with a USB connection terminal (23), and the PC (8) is provided with a USB connection port (81). If the USB connection terminal (23) is protrudingly provided on a surface of a casing (3) of the audio recording device (1), the terminal (23) is easily damaged by shocks, etc., and this is also undesirable from a design perspective. The USB connection terminal (23) is therefore located in a concave portion (30) formed in a bottom portion of the casing (3) of the conventional audio recording device (1). Further, when connecting the audio recording device (1) to the PC (8), a connection cable (7) is used that is provided with a USB connection port (71) on one end and with a USB connection terminal (72) on the other end. The audio recording device (1) is connected to the PC (8) by inserting the USB connection terminal (23) of the audio recording device (1) into the USB connection port (71) of the connection cable (7), and inserting the USB connection terminal (72) of the connection cable (7) into the USB connection port (81) of the PC (8).

The IC memory (not illustrated) of the audio recording device (1) is recognized by the PC (8) when a plug-and-play function of an operating system provided in the PC (8) is activated, after the audio recording device (1) is connected to the PC (8). Audio data can be transmitted between the audio recording device (1) and the PC (8) using the operating system of the PC (8). For example, editing, processing, and converting to text the data digital audio data in the audio recording device (1) are performed using the PC (8). If the audio recording device (1) is provided with a playback function, digital audio data can be transferred from the PC (8) to the audio recording device (1). Using the PC (8), the data digital audio data in the audio recording device (1) can also be sent to and from another PC using electronic communications lines such as the internet.

As described above, the intervention of the connection cable (7) is required to connect the audio recording device (1) to the PC (8), so storage of the connection cable (7) is inconvenient for users, and furthermore users cannot connect the audio recording device (1) to the PC (8) if the connection cable (7) is misplaced. The audio recording device (1), which is provided with an IC memory, is compact and lightweight, and has the special advantage of outstanding portability. The fact that the connection cable (7) must be carried separately in order to connect to the PC (8) significantly diminishes these advantages of the audio recording device (1).

Moreover, in automobiles or on trains, under circumstances where working space is limited, when using the audio recording device (1) connected to the PC (8) as shown in FIG. 9, there may be no space separate from the PC (8) to place the audio recording device (1), and the audio recording device (1), when placed, may fall to the floor and break due to vibration or other causes. However, protrudingly providing the USB connection terminal (23) to the surface of the casing (3) of the audio recording device (1) to make it possible to connect the audio recording device (1) directly to the PC (8) is impracticable when protection of the USB connection terminal (23) and design are considered.

On the other hand, as shown in FIG. 9, the conventional audio recording device (1) may be placed on a tabletop for audio recording of meetings, seminars, and other events. In this situation, there was a problem in that collecting audio using an internal microphone would cause vibration noise from the tabletop surface to be collected by the microphone and recorded together with the audio, due to the close distance between the tabletop surface where the audio recording device (1) is placed and the microphone.

The present invention resolves the above-mentioned problems and presents an audio recording device which can be directly connected to a PC or other external device without protrudingly providing a USB connection terminal or other connection terminals for external devices on the surface of the casing, and wherein vibration noise from the surface on which the audio recording device is placed is not collected by an internal microphone or other sound collection means.

DISCLOSURE OF INVENTION

An audio recording device of the present invention is provided with a sound collection means, a terminal for connection to an external device, a first casing, and a second casing, wherein one end portion of the second casing is rotatably joined to a lower end portion of the first casing, such that the second casing can be folded and stored on a rear side of the first casing; the sound collection means is provided at an upper portion of the first casing; and the connection terminal is protrudingly provided on another end portion of the second casing.

Further, in the audio recording device of the present invention, a recessed portion into which the connection terminal is fitted may be formed on a raised portion on the rear side of the first casing, and a front end of the connection terminal may be covered by a wall of the recessed portion when the second casing is folded and stored.

Furthermore, in the audio recording device of the present invention, a supporting member which abuts with the connection terminal may be provided on the rear side of the first casing.

When connecting to an external device, the audio recording device of the present invention can be directly connected to an external device without the intervention of a connection cable simply by inserting the front end of the second casing into a connection port of the external device, because the connection terminal is protrudingly provided on the front end of the second casing. Additionally, the second casing can be folded and stored on the rear side of the first casing, so when the audio recording device is not connected to a PC or other device, the audio recording device can be handled in a compact condition wherein the connection terminal does not protrude. Additionally, since the sound collection means is provided on a top portion of the first casing, suitably opening the first casing and the second casing, orienting the second casing downward, and placing the audio recording device on a tabletop enables the second casing to fulfill the function of a stand and reduces vibration noise collected by the sound collection means from the placement surface.

The connection terminal and the second casing of the audio recording device of the present invention are protected from deformation and damage, etc., due to external force, in particular lateral force, by fitting the connection terminal into the recessed portion of the raised portion of the first casing when the second casing is in a stored state, and foreign matter is prevented from entering an interior of the connection terminal through a front end portion. To further prevent entry of foreign matter into the connection terminal, it is desirable that the front end portion of the connection terminal is covered by the wall of the recessed portion when the second casing is in a folded and stored state.

If the supporting member which abuts the connection terminal on the rear side of the first casing is provided on the audio recording device of the present invention, the connection terminal and the second casing are protected from deformation and damage, etc., by external force, in particular force from the rear surface side, when the second casing is in a folded and stored state.

BRIEF DESCRIPTION OF DRAWINGS

FIG. 5A is a lateral view of an audio recording device according to the present invention, and FIG. 5B is a rear view of the same.

BEST MODE FOR CARRYING OUT THE INVENTION

Figure 9:
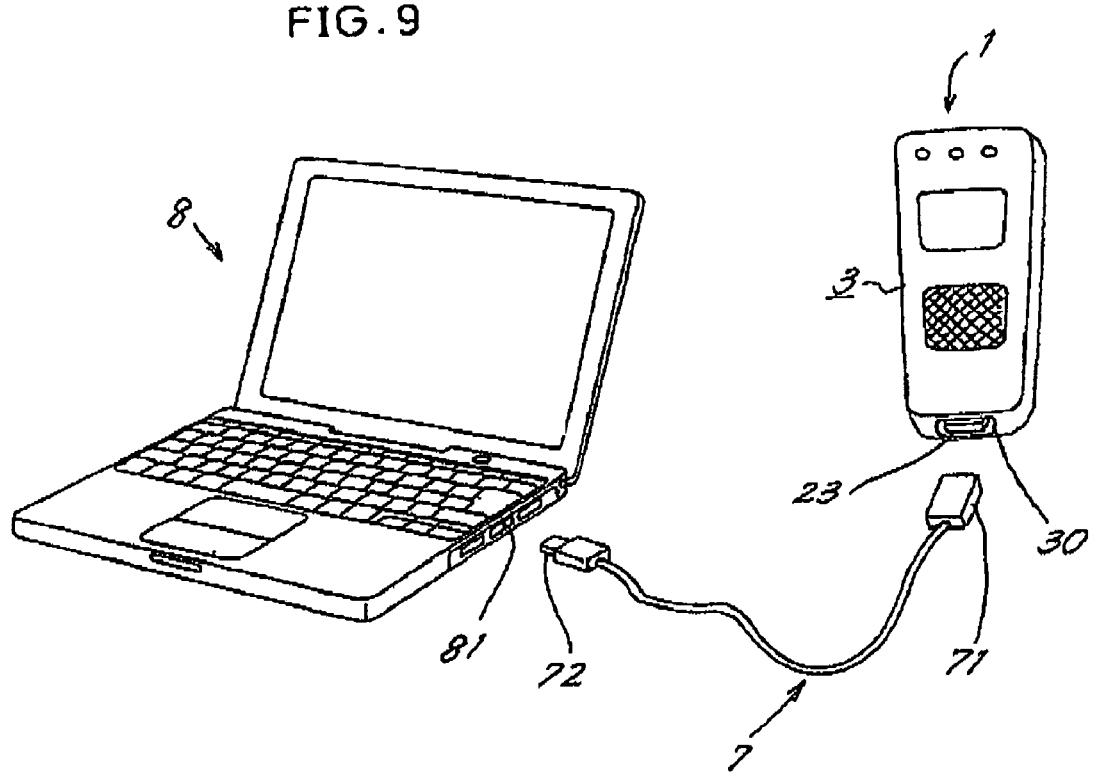
FIG. 9 is an explanatory diagram of a mechanism for connecting a conventional audio recording device and a PC.

The following is a description of an embodiment of the present invention, with reference to the drawings. The same symbols are used for identical or similar parts of the conventional device shown in FIG. 9.

Figure 1:
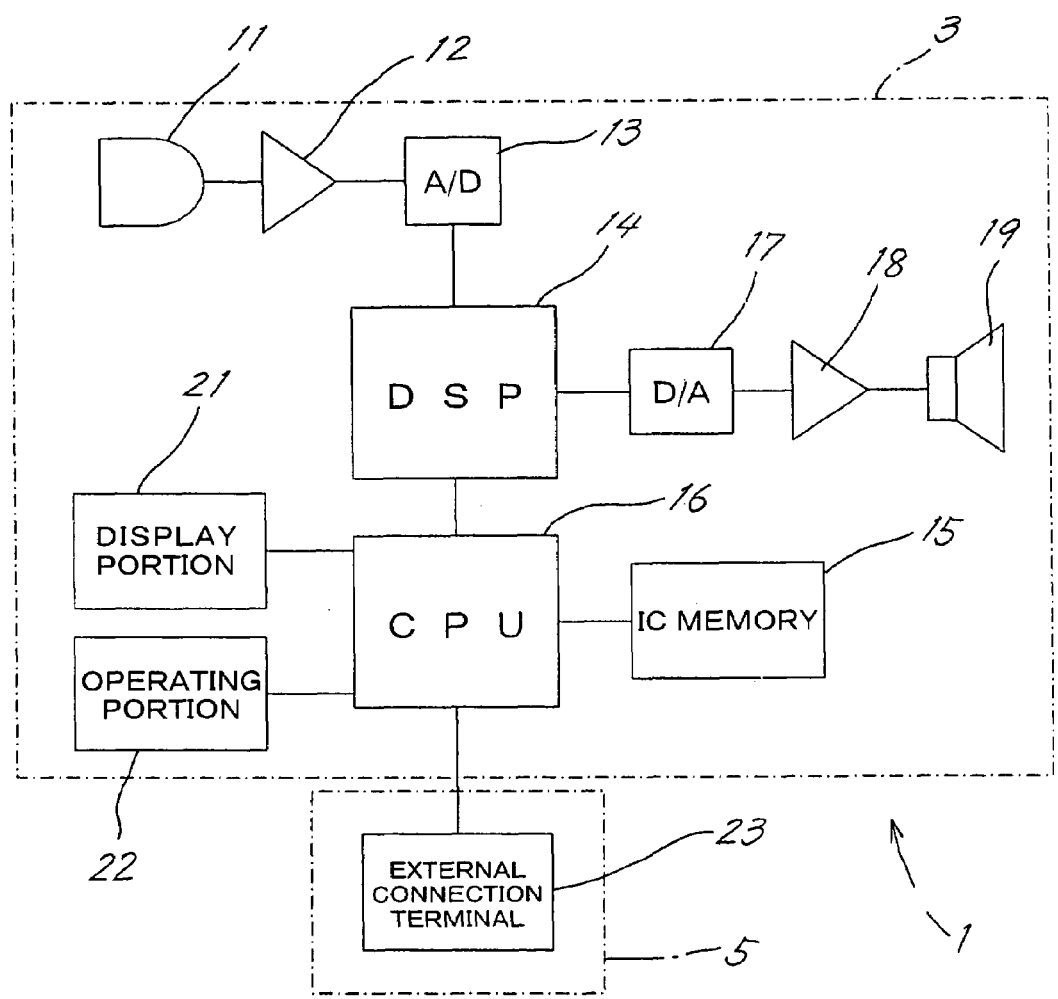
FIG. 1 is a block diagram which shows a basic configuration of an audio recording device according to the present invention.

FIG. 1 is a block diagram which shows a basic configuration of an audio recording device (1) according to the present invention. A microphone (11), which is a sound collection device, collects audio to be stored and converts it into an analog electric signal. The analog electric signal is amplified by an amplifier (12) and digitized by an A/D converter (13). ADSP (digital signal processor) (14) performs compression and other processes on the digital audio signal which is input from the A/D converter (13).

The audio recording device (1) of the present embodiment is provided with an IC memory (15) as a recording medium for storing audio data. The IC memory (15) may be in card form and configured such that it can be freely attached and removed to and from the audio recording device (1). A CPU (16) performs control for storing the digital audio data input from the DSP (14) in the IC memory (15). Since the audio recording device (1) of the present embodiment is provided with a playback function for audio data, the CPU (16) performs control for reading the digital audio data from the IC memory (15). The digital audio data read from the IC memory (15) is converted into an analog signal by a D/A converter (17) after processes such as decompression, etc., are performed in the DSP. The analog signal is amplified by an amplifier (18) and then converted to audio by a speaker (19). The audio recording device (1) is provided with a battery for supplying electric power to internal devices such as the DSP (14) and the CPU (16), although this is not shown in FIG. 1.

The audio recording device (1) is provided with a display portion (21) which displays various types of information related to storage and playback of audio data, device status, etc., and an operating portion (22) through which the user can enter operating commands, such as stopping and starting recording and playback, and these are connected to the CPU (16). The display portion (21) includes an LCD panel (36), described below, and the operating portion (22) includes operating switches (37) and a jog switch (38), described below. An external connection terminal (23) for connecting to external devices is connected to the CPU (16). Additionally, the audio recording device (1) can be connected to external devices such as a PC via the external connection terminal (23) and transmit data to and from those external devices. The audio recording device (1) of the present embodiment is provided with a USB terminal (male) as the external connection terminal (23) which can transmit data to and from the external devices via a USB.

Figure 2:
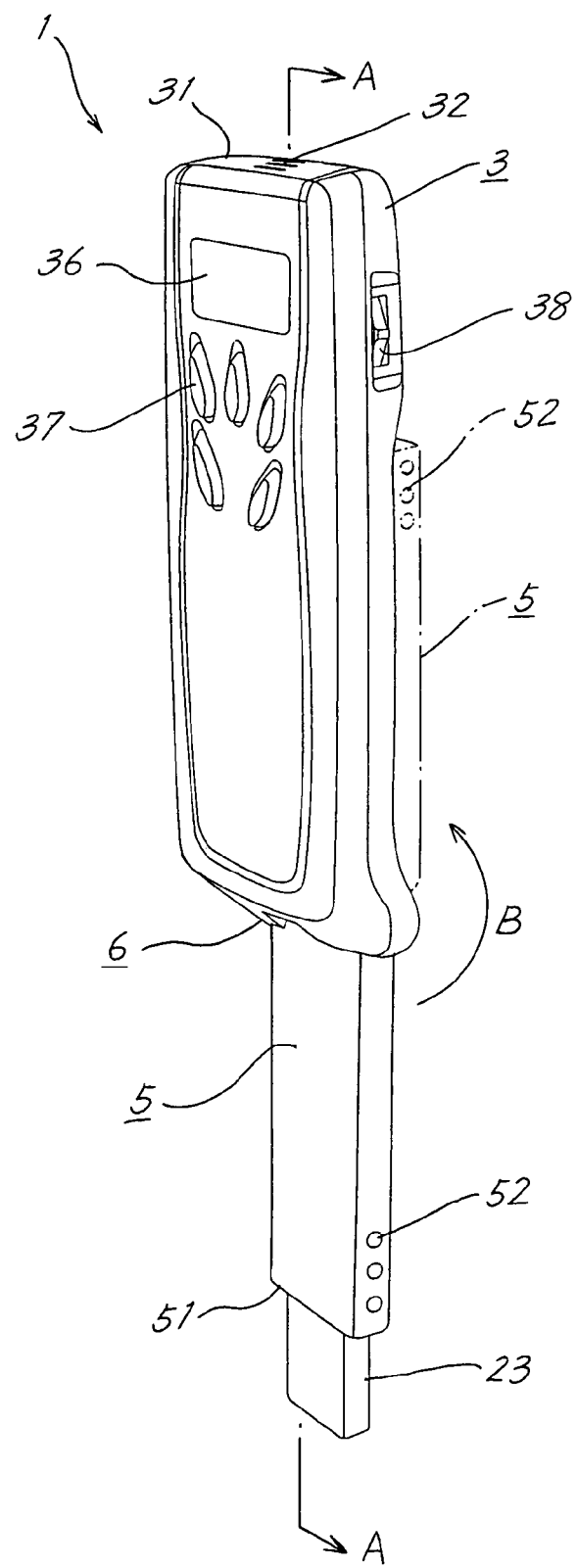
FIG. 2 is a perspective view of an audio recording device according to the present invention as seen from the side.
Figure 3:
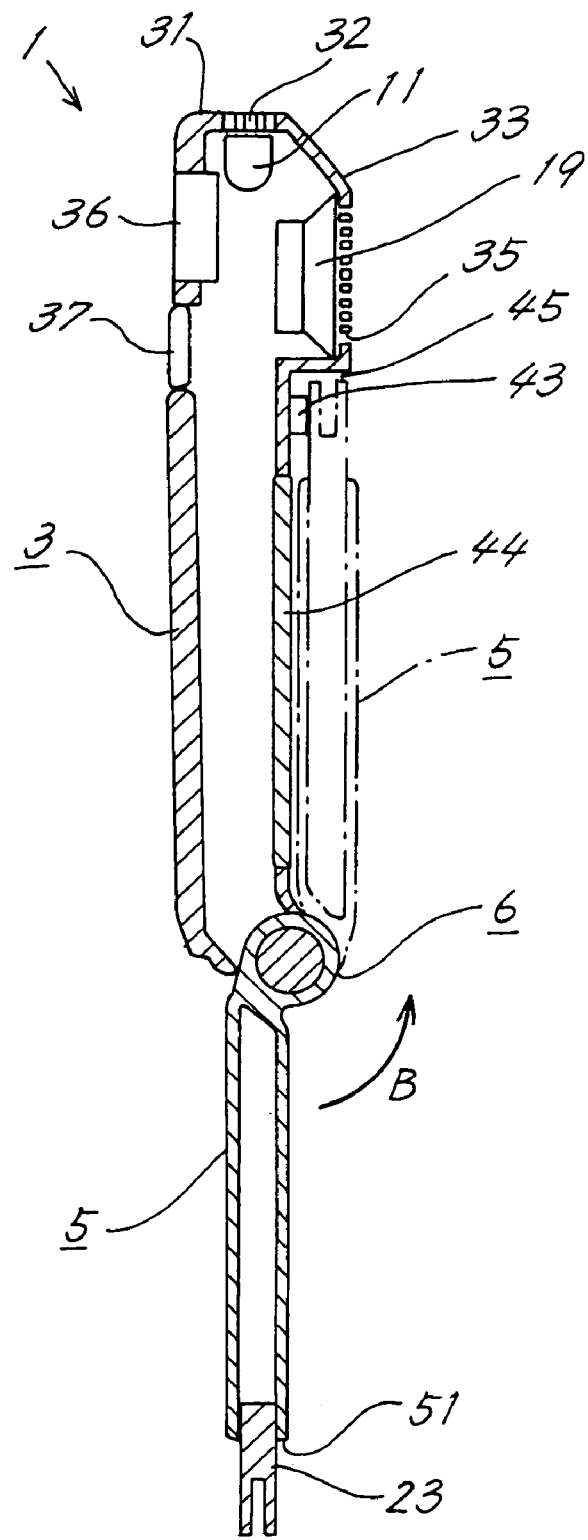
FIG. 3 is a longitudinal sectional view along a plane including a line A-A of an audio recording device according to the present invention in FIG. 2.

The audio recording device (1) is provided with a first casing (3) and a second casing (5), and folding the second casing (5) in the direction of arrow B allows it to be stored in a rear side of the first casing (3). The first casing (3) and the second casing (5) are both hollow and have an approximately rectangular parallelepiped form. One end portion of the second casing (5) is rotatably joined to a bottom end portion of the first casing (3) by a hinge mechanism (6). The second casing (5) can rotate approximately 180° with respect to the first casing (3), from a stored state shown in FIG. 6 to an open state shown in FIG. 2 and FIG. 5. A height, a horizontal width, and a thickness of the second casing (5) are all approximately half those of the first casing (3). The external connection terminal (23) is protrudingly provided lengthwise to the second casing (5) to an end surface (51) of the other end portion of the second casing (5). Raised portions (52), for making the second casing (5) easier to hold with the fingers when rotating it, protrude laterally near the external connection terminal (23) on both sides surface of the second casing (5).

Figure 4:
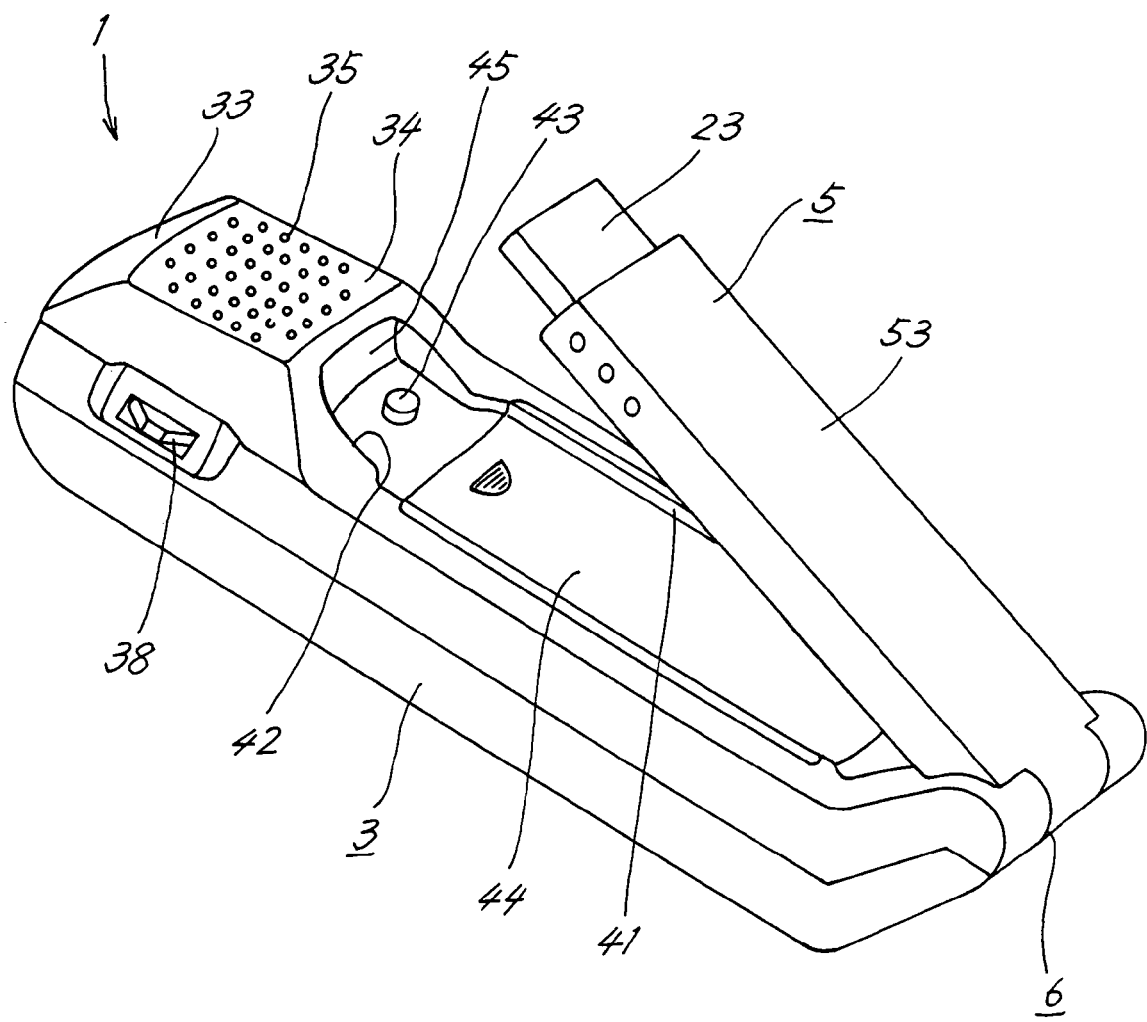
FIG. 4 is a perspective view of an audio recording device according to the present invention as seen from the front.

Various devices which make up the audio recording device (1) are stored in the first casing (3). The microphone (11) is stored in the upper end portion of the first casing (3), and an opening (32) is provided for collecting sound on an end surface (31) of the upper end portion of the first casing (3), opposite the microphone (11). An upper side of the rear surface of the No. 3 casing (3) protrudes in a square frustum shape as shown in FIG. 4, and the speaker (19) is provided in this raised portion (33), while a plurality of openings (35) to permit the passage of audio generated by the speaker (19) is provided on a top surface (34) of the raised portion (33). An LCD panel (36) is provided on a front upper side of the first casing (3), and a total of six operating switches (37) is provided below the LCD panel (36). Further, a jog switch (38) is provided on the other side of the first casing (3).

Referring to FIG. 4 and FIG. 5B, a shallow recessed portion (41) into which the second casing (5) can be fitted is formed on a rear surface of the first casing (3). Furthermore, a recessed portion (42), into which the external connection terminal (23) can be fitted, is formed connecting to the recessed portion (41) on a side of a lower portion of the raised portion (33) of the first casing (3). These recessed portions (41) and (42) reduce the risk of damage to the external connection terminal (23) and the second casing (5) during storage by limiting a lateral movement of the external connection terminal (23) and the second casing (5). One portion of the rear surface of the first casing (3) can be attached and removed as a battery lid (44), and most of a bottom surface of the recessed portion (41) is taken up by the battery lid (44). Moreover, instead of providing the recessed portion (41) into which the second casing (5) can be fitted, a pair of convex portions which grasp both side surfaces of the first casing (3) may be formed on the rear surface of the first casing (3) instead of the recessed portion (41).

A supporting member (43), which abuts the external connection terminal (23) when the second casing (5) is stored, is provided on the bottom surface of the recessed portion (42), into which the external connection terminal (23) is fitted. A thickness of the external connection terminal (23) is thinner than a thickness of the second casing (5). Therefore, there is a risk that the external connection terminal (23) may be damaged or deformed when a strong force is applied to the external connection terminal (23) (towards the first casing (3)), because the external connection terminal (23) is raised above the bottom surface of the recessed portion (42) if only the first casing (3) and the second casing (5) abut when the second casing (3) is stored. There is also a risk that the second casing (5) may be damaged or deformed by any damage or deformation to the external connection terminal (23). However, this situation is prevented by the supporting member (43) abutting the external connection terminal (23). The bottom portion of the recessed portions (41) and (42) may also be formed in a step shape, raising the side of the external connection terminal (23), instead of providing the supporting member (43).

Figure 6A:
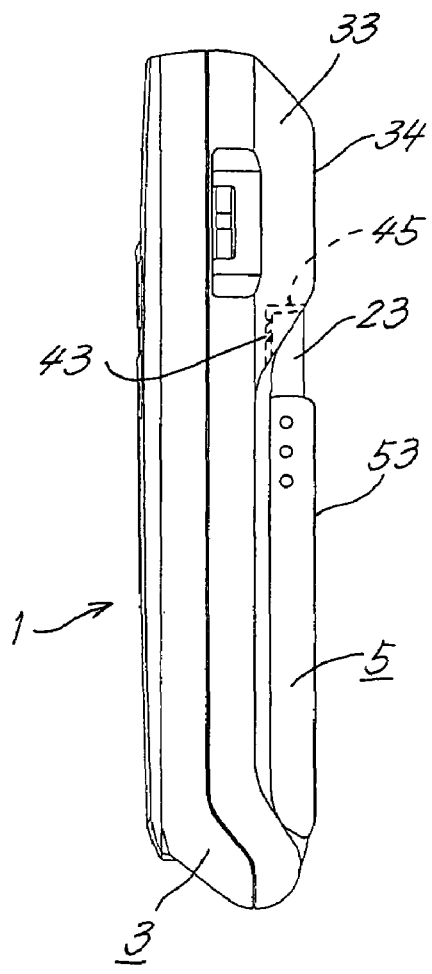
FIG. 6A is a lateral view of an audio recording device according to the present invention with a second casing in a stored state.
Figure 6B:
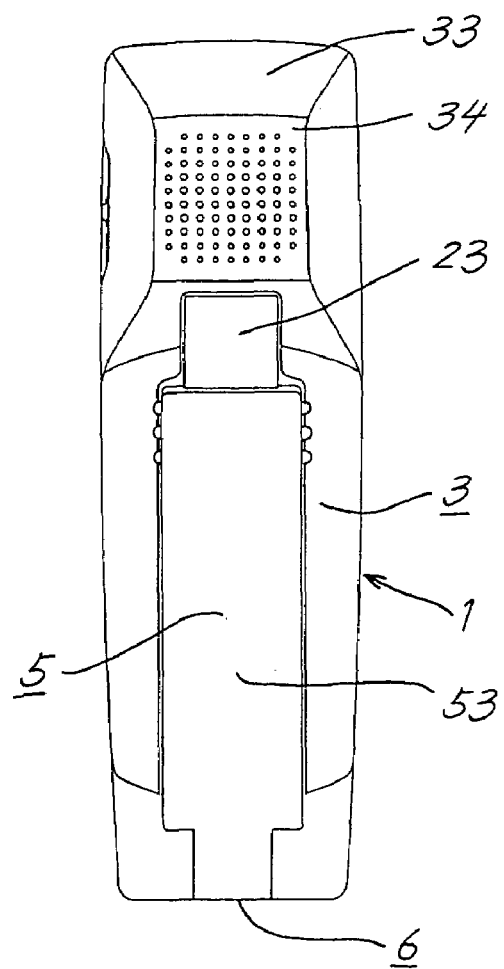
FIG. 6B is a rear view of the same.

In the present embodiment, a USB terminal is provided as the external connection terminal (23). As is commonly known, a USB terminal comprises a plate-shaped member which is provided with four pins on the inner surface of a metal tubular member with a substantially rectangular cross section, and a space is formed to the side where these pins are located. Accordingly, there is a risk of dirt or dust, located in pockets or bags, etc., entering an inner portion of the terminal through the opening at the front end of the USB terminal, if the audio recording device (1) is placed in a clothing pocket or bag, etc. However, according to the present invention, the external connection terminal (23) is located further inward than the top surface (34) of the raised portion (33) when the second casing (5) is stored, and a wall (45) of the recessed portion (42) covers the front end portion of the external connection terminal (23), as shown in FIG. 6A. Therefore, the risk of dirt or dust entering the external connection terminal (23) is reduced in the audio recording device (1) according to the present invention. The second casing (5) is prevented from opening by the front end of the external connection terminal (23) being caught on an edge of a pocket, etc., when the audio recording device (1) is inserted into a pocket or bag. Furthermore, as shown in FIG. 6A, it is desirable that a rear surface (53) of the second casing (5) is located on approximately the same plane as the top surface (34) of the raised portion (33) of the first casing (3) when the second casing (5) is stored.

The position of the second casing (5) can be fixed at angles at predetermined intervals with respect to the first casing (3). As a hinge mechanism (6), a gear (not shown), on which teeth are formed at intervals of approximately 30° is provided inside the second casing (5), are provided on a hinge mechanism (6), and a meshing member (not shown), engaging some of the teeth on the gear, is provided inside the first casing (3). When the second casing (5) is rotated, the meshing member elastically deforms in accordance with the rotation of the gears, and the second casing (5) clicks at intervals of approximately 30°. The configuration for fixing the position of the second casing (5) with respect to the first casing (3) is not limited to this, and other commonly known configurations may be used. Furthermore, the second casing (5) may be configured such that its position can be fixed at any angle with regard to the first casing (3).

Figure 7:
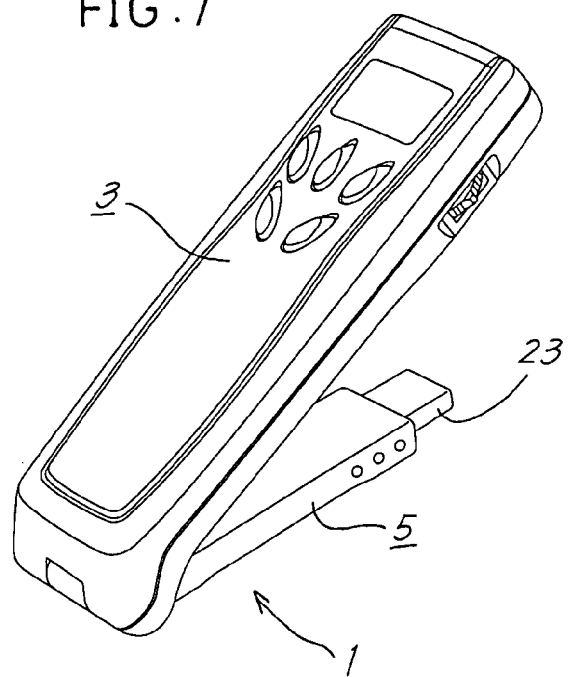
FIG. 7 is a perspective view of an audio recording device according to the present invention with the second casing rotated 30° from the stored state.

FIG. 7 is a perspective view of an audio recording device (1) seen from the front with the second casing (5) rotated approximately 30° from a stored state. When the audio recording device (1) is placed in this state on a table or on a floor with the second casing (5) in a downward orientation, the second casing (5) functions as a stand. Vibration noise communicated to the microphone (ii) from a table surface, etc., is reduced during recording as the microphone (11) is located at the top portion of the first casing (3), and is separated from the table surface or floor surface. Further, when the microphone (11) is oriented toward a source of sound to be recorded as shown in FIG. 7, a good placement is obtained for recording sound clearly with the audio recording device (1).

Figure 8:
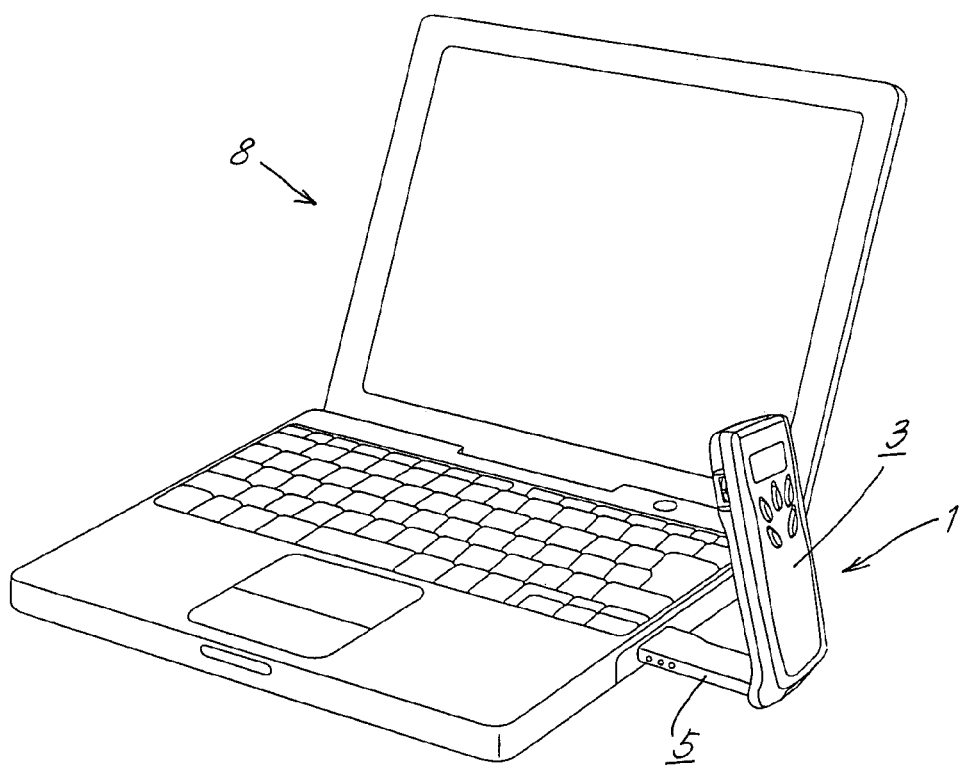
FIG. 8 is a perspective view of an audio recording device according to the present invention connected to a PC.

FIG. 8 is a perspective view showing the audio recording device (1) of the present embodiment connected to a PC (8), which is an external device. The external connection terminal (23) can easily be inserted into a connection port on the PC (8), since the external connection terminal (23) protrudes from an end surface of the second casing (5) end portion. Further, as described above, the position of the second casing (5) can be fixed at intervals of 30° with respect to the first casing (3), so the first casing (3) can also be positioned vertically. If the audio recording device (1) of the present embodiment is used connected to the PC (8) or other external device, there is no need to set aside a location for placing the audio recording device (1). Therefore, according to the present invention, in narrow work spaces, it is also possible to use the audio recording device while it is connected to an external device.

The above description of an embodiment is for describing the present invention, and should not be interpreted as limiting or restricting the scope of claims of the invention. Furthermore, it goes without saying that the configuration of the parts of the present invention is not limited to the above embodiment, and that various modifications are possible within the technical scope of the claims.

INDUSTRIAL APPLICABILITY

The audio recording device of the present invention can be directly connected to a PC or other external device without protrudingly providing a USB connection terminal or other connection terminal for external devices on a surface of a casing. Additionally, the audio recording device of the present invention can record clear audio as vibration noise from the surface on which the audio recording device is placed is mostly prevented from being collected by an internal microphone or other sound collection means.

The invention claimed is:

1. An audio recording device which is provided with a microphone, and a USB connection terminal to connect to an external device, the audio recording device comprising:
   a first casing having a front side and a rear side opposite the front side, and a second casing;
   wherein a first end portion of the second casing is rotatably joined to a first end portion of the first casing, such that the second casing can be folded and stored on the rear side of the first casing;
   wherein the microphone is located at a second end portion of the first casing opposite to the first end thereof;
   wherein the USB connection terminal is protrudingly provided on a second end portion of the second casing opposite to the first end thereof;
   wherein the position of the second casing can be fixed at predetermined angle intervals or at any angle with respect to the first casing; and
   wherein the audio recording device can he placed with the second casing functioning as a stand and the first casing tilting toward the USB connection terminal.

2. The audio recording device according to claim 1, comprising a supporting member, which abuts the USB connection terminal, provided on the rear side of the first casing.

3. The audio recording device according to claim 1, comprising a recessed portion, into which the USB connection terminal is fitted, formed from a raised portion on the rear side of the first casing.

4. The audio recording device according to claim 3, comprising a supporting member, which abuts the USB connection terminal, provided on the rear side of the first casing.

5. The audio recording device according to claim 3, wherein a front end portion of the USB connection terminal is covered by a wall of the recessed portion when the second casing is in a folded and stored state.

6. The audio recording device according to claim 5, comprising a supporting member, which abuts the USB connection terminal, provided on the rear side of the first casing.

7. An audio recording device which is provided with a microphone, and a USB connection terminal to connect to an external device, the audio recording device comprising:
   a first casing having a front side and a rear side opposite the front side, and a second casing;
   a hinge mechanism whereby a first end portion of the second casing is rotatably joined to a first end portion of the first casing, such that the second casing can be folded and stored on the rear side of the first casing;
   wherein the microphone is located at a second end portion of the first casing opposite to the first end thereof;
   wherein the USB connection terminal is protrudingly provided on a second end portion of the second casing opposite to the first end thereof; and
   wherein the hinge mechanism is fixable at predetermined angle intervals of the second casing with respect to the first casing.

8. The audio recording device according to claim 7, comprising a display on the front side of the first casing.

9. The audio recording device according to claim 7, comprising a recessed portion, into which the USB connection terminal is fitted, formed from a raised portion on the rear side of the first casing.

10. The audio recording device according to claim 9, wherein a front end portion of the USB connection terminal is covered by a wall of the recessed portion when the second casing is in a folded and stored state.

11. The audio recording device according to claim 9, wherein a thickness of the USB connection terminal is thinner than a thickness of the second casing, and comprising a supporting member, which abuts the USB connection terminal, provided on the rear side of the first casing, whereby, when a strong force is applied to the USB connection terminal towards the first casing damage or deformation to the USB connection terminal is prevented by the supporting member.

12. The audio recording device according to claim 11, wherein the support member comprises a bottom portion of the recessed portion formed in a step shape, raising the side of the USB connection terminal.

13. The audio recording device according to claim 9, comprising a loudspeaker on the rear side of the first casing between the second end of the first casing and the USB connection terminal when the first and second casings are folded together.

14. The audio recording device according to claim 13, wherein the rear side of the first casing adjacent the second end of the first casing and a surface of the second easing are aligned when the first and second casings are folded together.

* * * * *